United States Patent [19]
Suzuki

[11] Patent Number: 5,392,296
[45] Date of Patent: Feb. 21, 1995

[54] TESTING CIRCUIT PROVIDED IN DIGITAL LOGIC CIRCUITS

[75] Inventor: Hiroaki Suzuki, Tokyo, Japan
[73] Assignee: NEC Corporation, Japan
[21] Appl. No.: 937,653
[22] Filed: Aug. 31, 1992
[30] Foreign Application Priority Data Sep. 5, 1991 [JP] Japan .................................. 3-225554

[51] Int. Cl.6 ........................................ G01R 31/28
[52] U.S. Cl. ................................. 371/22.3; 371/22.1; 371/22.5
[58] Field of Search ..................... 371/22.1, 22.2, 22.3, 371/22.4, 22.5, 22.6; 324/73.1, 158 R

[56] References Cited

U.S. PATENT DOCUMENTS

| | | | |
|---|---|---|---|
| 4,710,927 | 12/1987 | Miller | 371/22.1 |
| 4,833,676 | 5/1989 | Koo | 371/22.3 |
| 4,864,579 | 9/1989 | Kishida et al. | 371/22.3 |
| 4,870,345 | 9/1989 | Tomioka et al. | 371/22.3 |
| 4,910,735 | 3/1990 | Yamashita | 371/22.1 X |
| 5,115,191 | 5/1992 | Yoshimori | 371/22.3 X |
| 5,130,988 | 7/1992 | Wilcox et al. | 371/22.3 |
| 5,233,612 | 8/1993 | Huyskens et al. | 371/22.3 X |
| 5,257,267 | 10/1993 | Ishizaka | 371/22.3 |
| 5,260,950 | 11/1993 | Simpson et al. | 371/22.5 X |
| 5,291,495 | 3/1994 | Udell, Jr. | 371/22.3 |

FOREIGN PATENT DOCUMENTS 0444825 9/1991 European Pat. Off. .

*Primary Examiner*—Emanuel T. Voeltz
*Assistant Examiner*—Eric W. Stamber
*Attorney, Agent, or Firm*—Whitham, Curtis, Whitham & McGinn

[57] ABSTRACT

A testing circuit for scan-pass testing an integrated circuit comprises a chain of serially connected scan-pass registers where an individual scan-pass register in the chain can be programmably selected for observation at a shift-out port located at the last scan-pass register in the serial chain. To programmably select a particular register, while a test signal is held active, a clock is pulsed and each clock pulse selects the next scan-pass register in the chain for observation, starting with the first scan-pass register. The register selected when the test signal becomes inactive is the register that is observed at the shift-out port at the end of the scan-pass register chain. The testing circuit permits the value of any register in the chain to be output in real-time without circuit interruption.

8 Claims, 5 Drawing Sheets

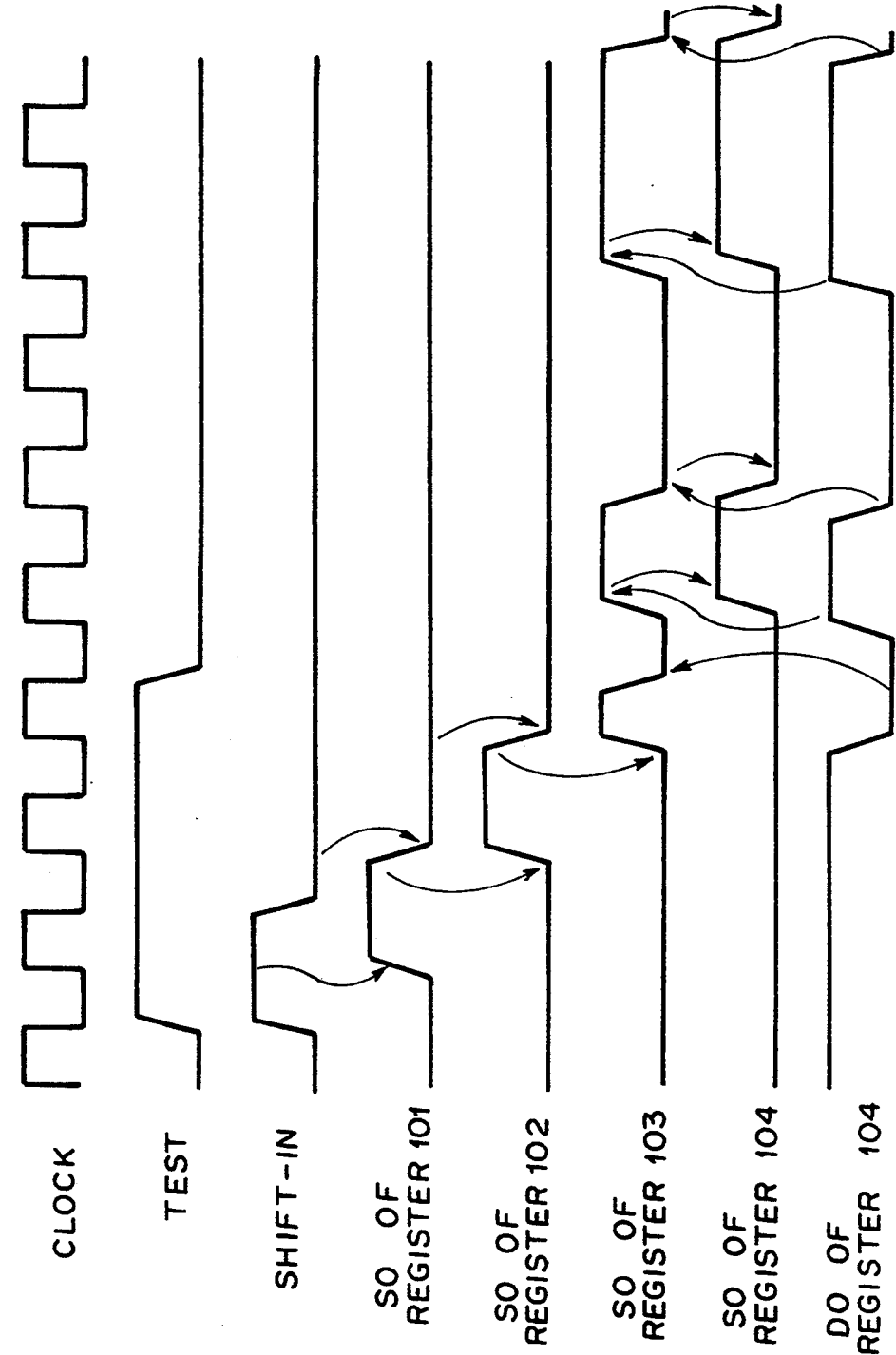

TESTING CIRCUIT PROVIDED IN DIGITAL LOGIC CIRCUITS

BACKGROUND OF THE INVENTION

The present invention relates to a testing circuit provided in a digital logic circuit for testing itself.

In a digital logic circuit such as an LSI, it is important to test whether its operation is normal or not. The test is usually carried out for analyzing a possible trouble occurred in the circuit, or for determining upon shipping whether it is good or not.

Testing of the digital logic circuit, in general, is carried out by entering a test pattern from the outside, and a resulting output pattern is analyzed to test the circuit.

In such tests, in particular, for LSIs, one of the most simple methods for observing the conduction of the circuit is to connect the internal nodes to be observed to the pins of the package. However, the number of input and output pins of the LSI package is finite, and it is impossible to take out all the great number of internal nodes to the cutside.

Therefore, in order to increase the observability of the internal node, a scan-pass method has been considered.

FIG. 1 shows an example of a digital logic circuit including a testing circuit which comprises a first combined circuit 1 having inputs of m-bits connected to an input terminal 11 and plurality of outputs; a second combined circuit 2 having a plurality of inputs and outputs of n-bits connected to an output terminal 12; and a plurality of scan-pass registers depicted by numerals 201 to 204. The construction and function of the scan-pass register depicted by numerals 201 to 204 are similar to each other and the scan-pass register 201 will be described below with reference to FIG. 2. The scan-pass register 201 comprises a multiplexer 210 and a data-type flip-flop 211. The multiplexer 210 has three inputs connected to a test TS, a data-in DI, and a shift-in SI terminals, respectively, and an output 0. The flip-flop 211 has an input D connected to the output 0 on the multiplexer 210, a clock input connected to a clock terminal CK and a Q-output connected to a data-out DO and a shift-out SO terminals. Each of the data-in terminals DI of the scan-pass registers 201 to 204 are connected to the outputs of the combined circuit 1, and each of the data-out terminals to the inputs of the combined circuit 2.

In addition, the shift-in terminal of the first scan-pass register 201 is connected to a shift-in terminal 13 and the shift-out terminal thereof is connected to the shift-in terminal SI of the second scan-pass register 202, and this connection is repeated with the remaining scan-pass registers 202 to 203, and the shift-out terminal SO of the final stage of scan-pass register 204 is connected to a shift-out terminal 14. Also, the test terminals of scan-pass registers 201 to 204 are connected to a test terminal TS, and the clock terminals of scan-pass registers to a clock terminal 15.

The signal supplied to the terminal TS switches the scan-pass register 201 into a normal mode and the test mode. During the normal mode, the multiplexer 210 allows to pass a signal supplied to DI to the input D of the flip-flop 211 through the output 0, so that the multiplexer 210 functions as an ordinary flip-flop.

On the other hand, during the test mode, the multiplexer 210 selects the signal on SI terminal which passes through the flip-flop 211 and then supplied to the SI terminal of the following scan-pass register 202. All the scan-pass registers perform the same function, the scan-pass registers act as a shift register. Therefore, the output on the terminal SO indicates the function of all the scan-pass registers in accordance with the timing of the clock signal on the terminal CK in a serial manner.

In the conventional testing circuit according to the scan-pass method as described above, since the internal flip-flops form a shift register during the test mode, data do not come out up to the observing point unless numerous clocks are entered, when one wants to know the status of the flip-flop of interest.

Furthermore, since, in the test mode, the internal FF operates as the shift register, execution of the program must be stopped, which lacks a real time performance.

Still further, as shown in FIG. 2, since data is entered to flip-flop via a multiplexer, some extent of delay results, which degrades the performance further than at the original maximum operating frequency of the circuit.

Accordingly, an object of the present invention is to provide a testing circuit which allows the register within the circuit to be specified in a programmable manner while allowing the value of that register to be emitted to the outside in real time without interrupting the execution of the program.

SUMMARY OF THE INVENTION

According to the present invention, there is provided a digital logic circuit which comprises a combined circuit having a plurality of outputs and scan-pass registers each connected to the respective output of said combined circuit;

each of said scan-pass register comprising a data input, a clock input, a shift signal input, a test input, a data output and a shift signal output, and serially connected in the manner that the shift signal output is connected to the shift signal input of the adjacent scan-pass register to form a serial circuit, the shift signal input of the foremost scan-pass register being connected to a shift-in terminal and the shift signal output of the rearmost scan-pass register being connected to a shift-out terminal;

each of said scan-pass registers comprising a first holding means for holding one of the outputs of said combined circuit, a second holding means for holding a signal on said shift-in terminal when a signal on said test signal input is active, a first selecting means for selecting one of the signals on said shift signal input and the signal from said first holding means in dependent of the output from said second holding means, and a second selecting means for selecting one of the signals on said second holding means and the output of said first selecting means in dependent of the signal on a test-in terminal.

The present invention will be more clearly understood from the detailed description with reference to the accompanying drawings.

BRIEF DESCRIPTION OF THE DRAWINGS

FIG. 5 is a timing chart of the signals on various points of the scan-pass register of FIG. 4.

DETAILED DESCRIPTION OF THE PREFERRED EMBODIMENT

Figure 1:
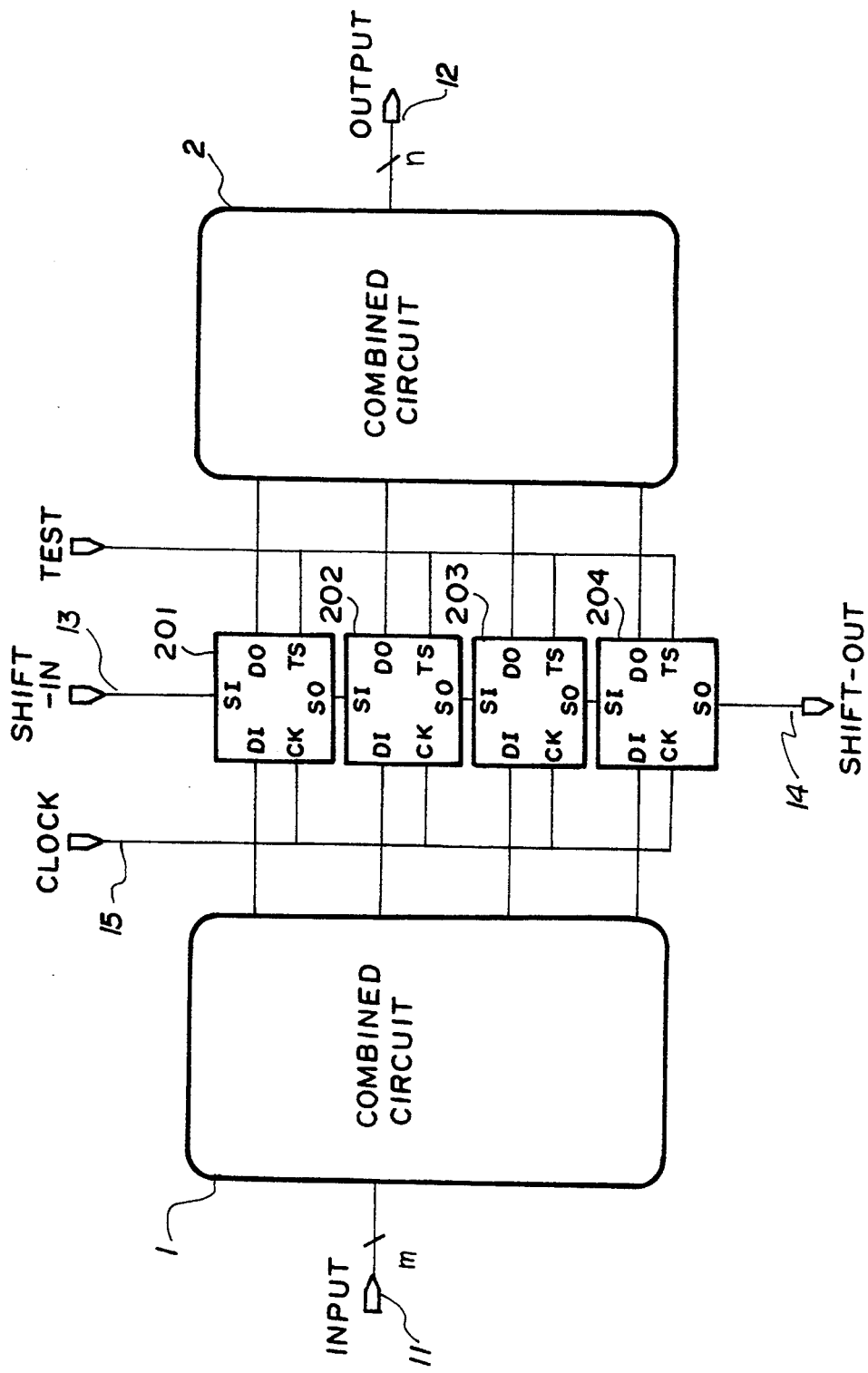
FIG. 1 is a block diagram of a conventional testing circuit.
Figure 2:
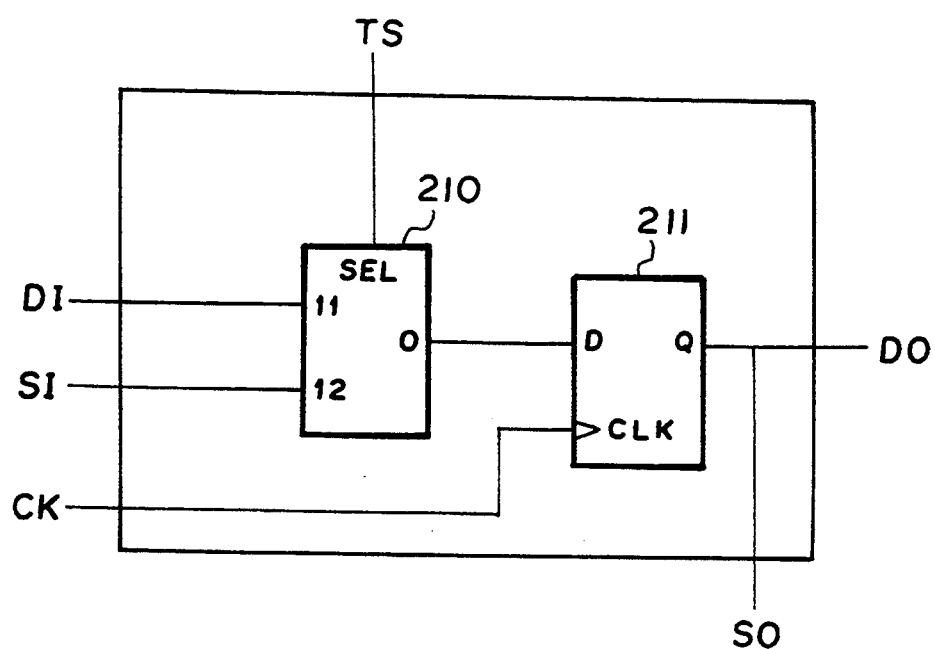
FIG. 2 is a block diagram of a scan-pass register of the circuit shown in FIG. 1.
Figure 3:
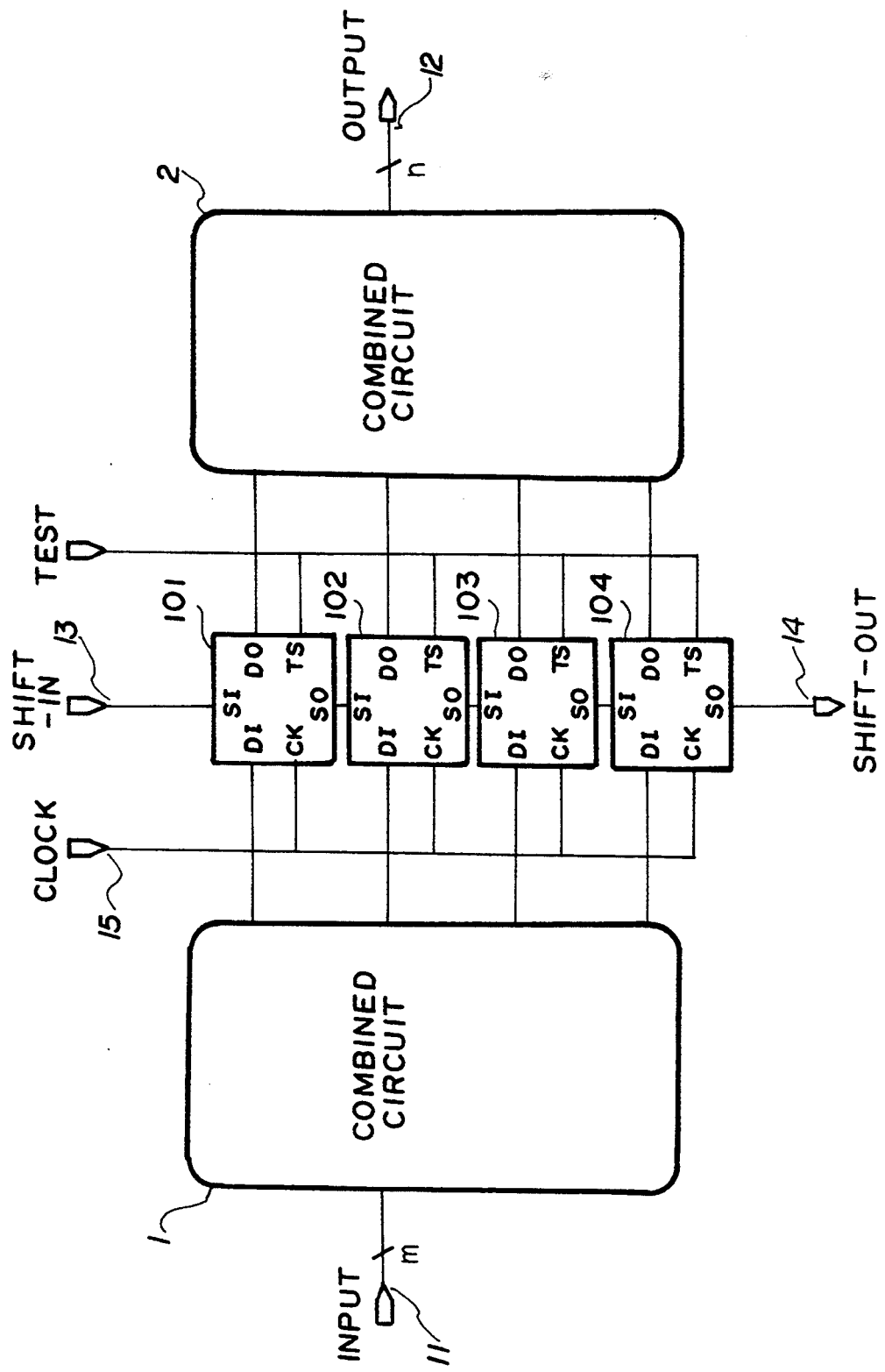
FIG. 3 is a block diagram illustrating an arrangement of a testing circuit of a digital logic circuit embodying the present invention.

Referring now to FIG. 3, there is shown the testing circuit of the present invention. The testing circuit comprises first and second combined circuits 1 and 2 and four scan-pass registers 101, 102, 103 and 104 for holding the state of the circuit. The number of the scan-pass registers is not restricted in the present invention. The connection between these elements are substantially the same as those illustrated in FIG. 1 and the detailed explanation will be omitted here to avoid repetition. The construction and function of the scan-pass registers 101, 102, 103 and 104, however, are critical and different from those of the conventional testing circuit as illustrated in FIGS. 1 and 2.

Figure 4:
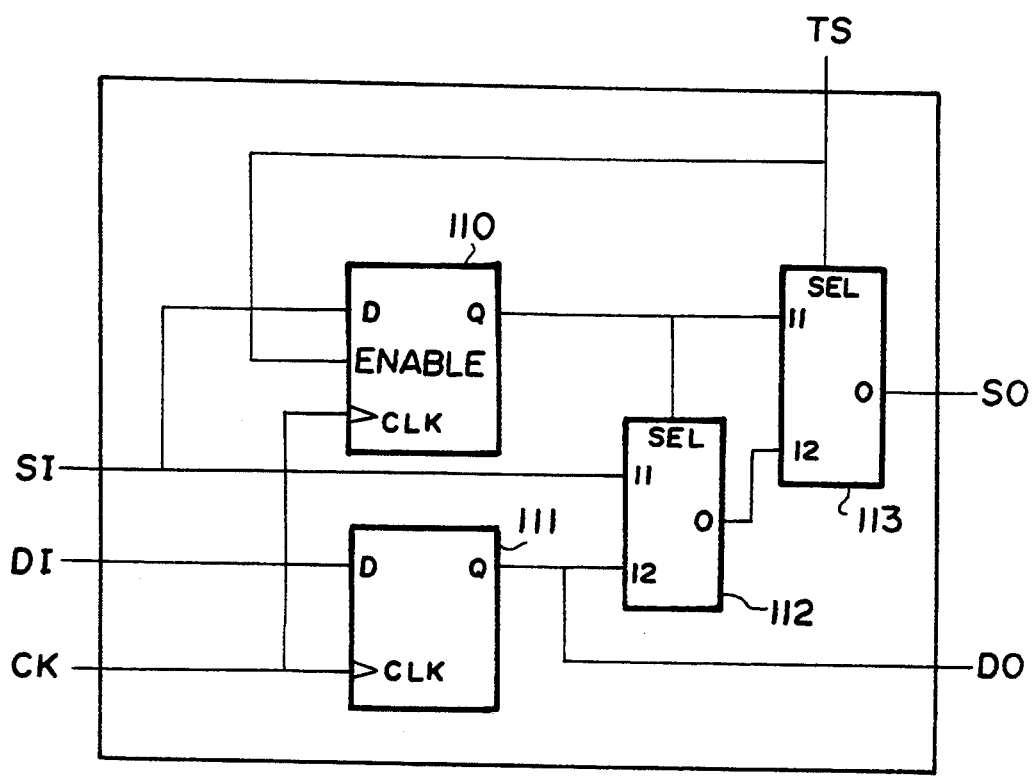
FIG. 4 is a block diagram of a scan-pass register of the circuit shown in FIG. 3.

Referring now to FIG. 4 which illustrates the first scan-pass register 101 of the testing circuit of the present invention, the scan-pass registers 101 comprises first and second data type flip-flops 110 and 111. The first flip-flop 111 has a data D and a clock CLK inputs connected to a data-in DI and the clock CK terminals, respectively. Also, the second flip-flop 110 has a data D, a clock CLK and an enable EN inputs connected to a shift-in SI, a clock CK and test TS terminals, respectively.

The scan-pass registers 101 comprises first and second multiplexers 112 and 113, each having two inputs, a selecting signal input SEL and an output. The first input of the first multiplexer 112 is connected to the shift-in terminal SI, the second input to the Q output of the first flip-flop 111, the selecting signal input SEL to the Q output of the second flip-flop 110, and the output to the second input of the second multiplexer 113. Also, the first input of the second multiplexer 113 is connected to the Q output of the second flip-flop 110 and the selecting signal input SEL of the first multiplexer 112, and the selecting signal input SEL of the second multiplexer 113 to the test terminal TS. The shift-out terminal SO is connected to the output of the second multiplexer 113, and the data-out terminal DO to the Q output of the first flip-flop 111. When the signal on the test terminal TS is active, the second flip-flop 110 stores the value on the shifting terminal SI, and the first flip-flop 111 stores the value on DI. The first multiplexer 112 selects the value on Q terminal of the first flip-flop 111 when the value on Q terminal of the second flip-flop 110 is active, and the value on the terminal SI is inactive. While, the second multiplexer 113 selects the value on Q terminal of the second flip-flop 110 when the value on terminal TS is active, and the output of the first multiplexer 112 is inactive.

The remaining scan-pass registers 102 to 104 have the same construction and function as that of the first scan-pass register 101.

The operation of the testing circuit of the present invention will be hereinafter described with reference to the drawings.

For the testing circuit having four scan-pass registers as illustrated in FIG. 3, in the following example, the data-output DO for the scan-pass register is observed In order to observe the output of any one of the scan-pass registers 101-104, the register must be set by activating the test terminal TS. In this state, if the second flip-flops 110, of scan-pass registers 101-104 have been reset, they operate as shift registers.

At the same time, the test terminal TS is turned active, a shift-in terminal SI is turned active over a single clock. The timing chart of the signals on the terminals are shown in FIG. 5. This shift operation causes the test terminal active over three clocks in this case, until the second flip-flop 110 of the register 103 to be observed has been set. By this operation, the second flip-flops 110 of the registers 101, 102, 103, 104 are each turned into "reset", "reset", "set" and "reset" states, respectively, and the register 103 is selected.

When the test terminal TS is turned inactive, a program, pattern and the like to be tested are entered to the circuit. At this time, a value equal to DO of the register 103 is generated to SO of the register 103. In addition, since a value equal to SI of the register 104 is supplied to SO of the register 104, the value on DO of the register 103 can be observed at the shift-out terminal SO. Furthermore, it can be realized by setting the flip-flop 110 of any one of the registers 101-104, the value DO of the register can be observed.

Although the above description was made for the testing circuit including four scan-pass registers, the present invention can be applied for the circuit having more than four registers.

As described above, according to the present invention, the value of any arbitrary register within the circuit can be emitted to the outside to readily detect whether the circuit operation is good or not, or any trouble is present or not. In addition, since the value can be observed in real time without interrupting the execution of the program, it is possible to carry out an efficient test in a short period of time.

In addition, even if the present invention is used, any extra delay is not caused to the original logic of the circuit, so that it can be avoided that the performance of the maximum operating frequency of the circuit is degraded.

What is claimed is:

1. In a digital logic circuit comprising a combined circuit having a plurality of outputs and scan-pass registers each connected to a respective output of said combined circuit, each of said scan-pass registers comprising:

a data input connected to an output of said combined circuit;

a clock input;

a shift signal input;

a test input;

a data output; and a shift signal output, wherein said Man-pass registers are serially connected such that said shift signal output of one of said scan-pass registers is connected to the shift signal input of an adjacent one of said scan-pass registers to form a serial circuit having a foremost Scan-pass shift register and are most scan-pass shift register, the shift signal input of the foremost scan-pass register being connected to a main shift-in terminal and the shift signal output of the rearmost scan-pass register being connected to an observation shift-out terminal;

each of said scan-pass registers comprising:

a first holding means connected to said data input for holding one of the outputs of said combined circuit;

a second holding means connected to said shift signal input and responsive to a signal on said test input for holding a signal on said shift-in input when a signal on said test input is active, mid first and second holding means each being responsive to a clock signal on said clock input;

a first selecting means connected to said shift signal input and to receive an output signal of said first holding means for selecting one of the signals on said shift signal input and the output signal from said first holding means in response to an output from said second holding means; and a second selecting means connected to receive output signals from said second holding means and from said first selecting means for selecting between the output signal of said second holding means and the output of said first selecting means in response to the signal on test input.

2. The digital logic circuit according to claim 1 wherein said first and said second holding means are flip-flops.

3. The digital logic circuit according to claim 1 wherein said first and second selecting means are multiplexers.

4. The digital logic circuit according to claim 1 which further comprises a second combined circuit having a plurality of inputs connected to said data output and said shift signal output of each of said scan-pass registers.

5. A testing circuit for testing a combined logic circuit comprising a chain of serially connected scan-pass registers, each of scan-pass registers having a shift-in input port and a shift-out output port, the shift-in input port of a first of said chain of serially connected scan-pass registers receiving a shift signal and the shift-in input port of subsequent ones of said chain of serially connected scan-pass registers being connected to the shift-out output port of a next preceding one of said scan-pass registers, the shift-out output port of a last one of said chain of serially connected scan-pass registers providing a shift-out signal from the chain, wherein an individual one of said scan-pass registers can be programmably selected for observation at the shift-out output port of the last one of said scan-pass registers, each of said scan-pass registers comprising:

a data-input port connected to a corresponding output of the combined logic circuit to be tested;

a first flip-flop having a set input connected to said data-input port for holding data from said data input port in response to a clock signal;

a second flip-flop having a set input connected to said shift-in input port for holding data from said shift-in input port in response to said clock signal and when a test signal is active;

a first selector means having a first input connected to an output of said first flip-flop and a second input connected to said shift-in input port for selecting between the output of said first flip-flop and a signal on said shift-in input port in response to an output of said second flip-flop; and a second selector means having a first input connected to the output of said second flip-flop and a second input connected to an output of said first selector means for selecting between the output of said second flip-flop and the output of said first selector means in response to said test signal, said second selector means selecting the output of said second flip-flop output when said test signal is active, whereby an individual one of said scan-pass registers is programmably selected for observation at the shift-out output port of the last one of said scan-pass registers in said chain by holding said test signal active over a number of clock cycles corresponding to one of said scan-pass registers to be observed.

6. A testing circuit for testing an integrated circuit as recited in claim 5 wherein said first and said second selector means are multiplexers.

7. A testing circuit for testing an integrated circuit as recited in claim 5 wherein said first and said second flip-flops are D-type flip-flops.

8. A testing circuit for testing an integrated circuit as recited in claim 5 wherein each of said scan-pass registers further has a data-output port connected to the output of said first flip-flop, said data-output ports of said scan-pass registers being connected to corresponding inputs of a second combined logic circuit.

* * * * *